United States Patent
Haroun et al.

(10) Patent No.: US 6,784,699 B2
(45) Date of Patent: Aug. 31, 2004

(54) GLITCH FREE CLOCK MULTIPLEXING CIRCUIT WITH ASYNCHRONOUS SWITCH CONTROL AND MINIMUM SWITCH OVER TIME

(75) Inventors: Baher S. Haroun, Allen, TX (US); Heng-Chih Lin, Plano, TX (US); Tim Foo, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/292,243

(22) Filed: Nov. 12, 2002

(65) Prior Publication Data

US 2003/0184347 A1 Oct. 2, 2003

Related U.S. Application Data

(60) Provisional application No. 60/368,240, filed on Mar. 28, 2002.

(51) Int. Cl.[7] .............................................. H03K 17/00
(52) U.S. Cl. ........................................ 327/99; 327/407
(58) Field of Search .......................... 327/99, 291–294, 327/298, 407

(56) References Cited

U.S. PATENT DOCUMENTS

| | | | | |
|---|---|---|---|---|
| 4,853,653 A | * | 8/1989 | Maher | 331/49 |
| 5,357,146 A | * | 10/1994 | Heimann | 327/292 |
| 5,652,536 A | * | 7/1997 | Nookala et al. | 327/298 |
| 5,726,593 A | * | 3/1998 | Ruuskanen | 327/99 |
| 5,811,995 A | * | 9/1998 | Roy et al. | 327/99 |
| 6,107,841 A | * | 8/2000 | Goodnow | 327/99 |
| 6,535,048 B1 | * | 3/2003 | Klindworth | 327/407 |
| 6,563,349 B2 | * | 5/2003 | Menezes et al. | 327/99 |
| 6,600,345 B1 | * | 7/2003 | Boutaud | 327/99 |

* cited by examiner

Primary Examiner—My-Trang Nu Ton
(74) Attorney, Agent, or Firm—Frederick J. Telecky, Jr.; W. James Brady, III

(57) ABSTRACT

A symmetric glitch free clock multiplexing circuit allows the input clock to a digital or analog processing unit to be switched from one frequency to the other at any moment during the operation, assuming the respective clocks themselves are stable. There exist no restrictions on the clocks or the switch control signal to be synchronous in any fashion. This circuit guarantees a glitch free output and also prevents short cycling of the output clock. Since all the related clocks and switch control signal are asynchronous, this circuit further eliminates meta-stability problems. Its symmetrical architecture allows the circuit to function with the output clock being switched from slow clock to fast clock and vise versa. More importantly, the complete switch over only takes two cycles of the targeted clock in the best case once the active clock is turned off, when switching from slow to fast clock; and four target clock cycles in the worst case once the active clock is turned off, when switching from fast to slow clock.

8 Claims, 3 Drawing Sheets

GLITCH FREE CLOCK MULTIPLEXING CIRCUIT WITH ASYNCHRONOUS SWITCH CONTROL AND MINIMUM SWITCH OVER TIME

CLAIM TO PRIORITY OF PROVISIONAL APPLICATION

This application claims priority under 35 U.S.C. §119(e)(1) of provisional application Serial No. 60/368,240, filed Mar. 28, 2002, by Heng-Chih Lin, Baher S. Haroun and Tim Foo.

BACKGROUND OF THE INVENTION

1. Field of the Invention

This invention relates generally to clock multiplexing, and more particularly to a symmetric glitch free clock multiplexing circuit with asynchronous switch control.

2. Description of the Prior Art

Many system-on-chip (SOC) circuits currently on the market consist of multiple dedicated processing modules that interact harmoniously with each other to achieve the desired functionality. SOC designs become very attractive in the advance of wireless and handheld devices because they deliver lower cost, power consumption and form factor.

A significant challenge associated with integration of different functional modules in a SOC is presented by modules operating at different clock frequencies. Further, such integration can become even more complex when an individual module can also be operating at different clock frequencies depending on the overall state of the SOC device. As many designers carefully squeeze out every last pico-second from the circuit datapath, any uncertainty that might affect the input clock can spell disaster to the SOC device functionality. Many embedded electronic systems, for example, frequently require certain circuit modules to be turned on and off or to be running at different clock frequencies depending on the state of the systems. These clock frequencies might not be synchronous to each other, nor to the control signal that commands the frequency change. Even when these clocks are synchronous, the phase differences might not be always known, which can create a glitch or short cycled output clock that can potentially cause problems in the circuit.

It is therefore advantageous and desirable to provide a system and method for allowing a SOC circuit to freely turn on or off and switch clock frequencies to any associated circuit modules without causing any module malfunction due to glitches in the clocking system.

SUMMARY OF THE INVENTION

The present invention is directed to a symmetric glitch free clock multiplying circuit that allows the input clock to a digital or analog processing unit to be switched from one frequency to the other at any moment during the operation, assuming the perspective clocks themselves are stable. There exist no restrictions on the clocks or the switch control signal to be synchronous in any fashion. This circuit guarantees a glitch free output and also prevents short cycling of the output clock. Since all the related clocks and switch control signal are asynchronous, this circuit further eliminates meta-stability problems. Its symmetrical architecture allows the circuit to function with the output clock being switched from slow clock to fast clock and vise versa. More importantly, the complete switch over only takes as low as two cycles of the targeted clock once the active clock is turned off, when switching from slow to fast clock.

According to one embodiment, a clock multiplexer comprises: a first cascaded synchronization circuit configured to generate a first output clock in response to a reference clock and a switch control signal; a second cascaded synchronization circuit configured to generate a second output clock in response to a fast clock and the switch control signal; and a combinational element configured to generate a substantially glitchless output clock in response to the first output clock and the second output clock.

According to another embodiment, a method of generating substantially glitch free clock switching comprises the steps of: providing a first cascaded synchronization circuit configured to generate a slow internal clock in response to a reference clock and a switch control signal that is asynchronous to the reference clock; providing a second cascaded synchronization circuit configured to generate a fast internal clock in response to a fast clock and the switch control signal; and generating a substantially glitch free output clock in response to the slow internal clock and the fast internal clock.

According to yet another embodiment, a clock multiplexer comprises: a first synchronization circuit configured to generate a slow internal clock in response to a reference clock and a switch control signal; a second synchronization circuit configured to generate a fast internal clock in response to a fast clock and the switch control signal; and at least one logic device configured to generate a substantially glitch free output clock that is devoid of short cycling, in response to the slow internal clock and the fast internal clock.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Modem SOC devices often consist of many functional modules, as well as many phase lock loops (PLL)s to supply multiple clocks to individual blocks. At times, certain modules are required to operate at multiple clock frequencies which may change during operation depending on the state of the SOC.

Figure 1:
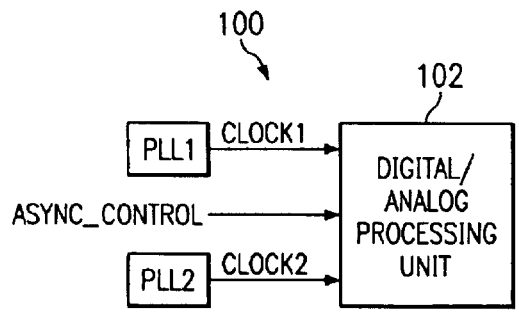
FIG. 1 is simple block diagram showing a typical system that employs multiple clock frequencies associated with a common functional unit.

FIG. 1 shows a typical system 100 that employs a digital or analog processing unit 102 that operates at multiple clock frequencies depending on an asynchronous switch control signal. Without proper care, the input clock to this processing unit (SOC) 102 may glitch during switch over which may cause the entire SOC 102 to malfunction.

Figure 2:
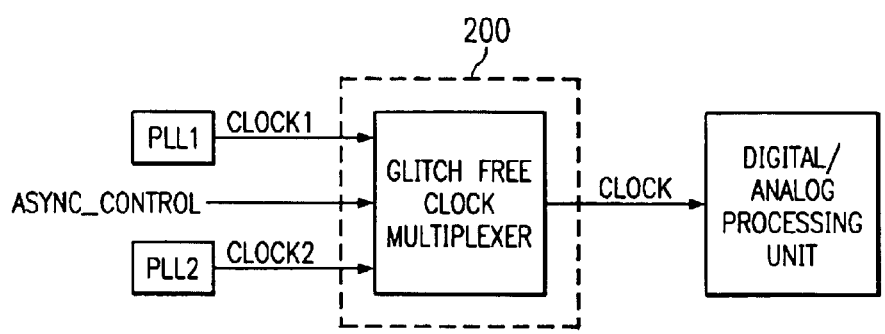
FIG. 2 is a simple block diagram showing the addition of a glitch free clock multiplexer that has been added to the system illustrated in FIG. 1.

FIG. 2 is a simple block diagram showing the addition of a glitch free clock multiplexer 200 that has been added to the system 100 illustrated in FIG. 1. The glitch free clock multiplexer 200 properly handles the switch over discussed herein before to prevent such disastrous events from occurring.

Figure 3:
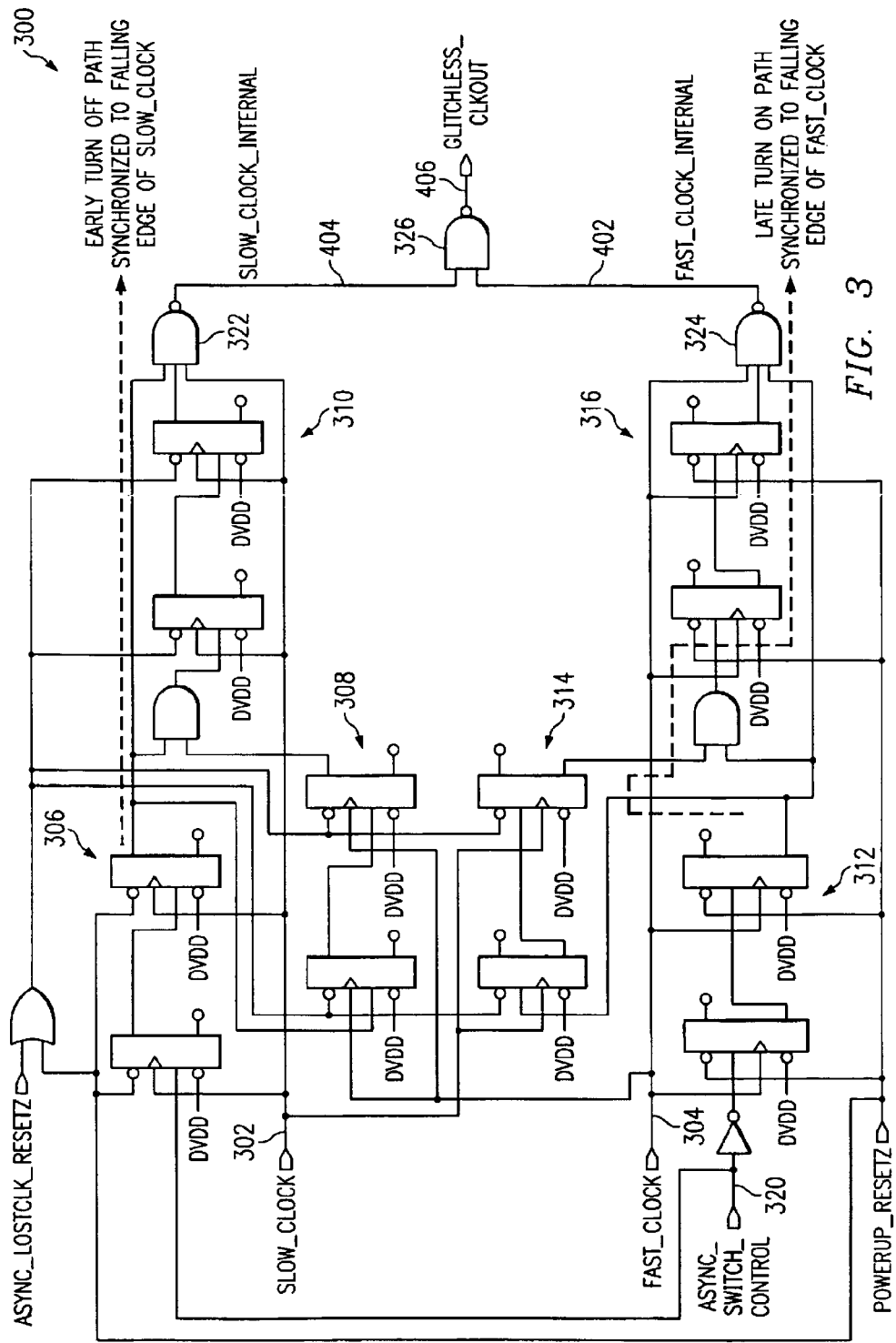
FIG. 3 illustrates a symmetric glitch free clock multiplexing circuit according to one embodiment of the present invention.

Circuits employed by this invention are based on the "stop one before start the other" technique commonly used to achieve glitch free multiplexing. FIG. 3 illustrates a symmetric glitch free clock multiplexing circuit 300 according to one embodiment of the present invention. Circuit 300 can be seen to include two identical paths taken by the two input clocks 302, 304. Three sets of cascaded synchronization flip-hops 306, 308, 310 and 312, 314, 16 are used in path. The first set of synchronization flip-flops 306, 312 provides the secured synchronization of the asynchronous switching control signal 320 in to respective clock domains. The output of these synchronization flip-flops acts as an early turn off signal to the active clock path by disabling the first input the three input NAND gate 322 at the end of the top path. Once the clock on the top path been turned off, the second set of synchronization flip-flops 314 on the bottom path, driven by the coupled clock, provides a synchronized, thus delayed due to the third set of synchronization flip- pa 316, turn on path to the second input of the three input NAND gate 324, at the end of the bottom path. All the flip-flops trigger on the falling edge of the fast clock 304 to control when the clocks are NANDed together at the third input to the three input NAND gates provide glitchless outputs. The two outputs of the top and bottom path are NANDed at the last stage 326 in the circuit 300 to provide the final output clock. Since the outputs from the two paths are based on "stop one before start the other" technique, the output of the NAND gate 326 is guaranteed to be glitch free.

Figure 4:
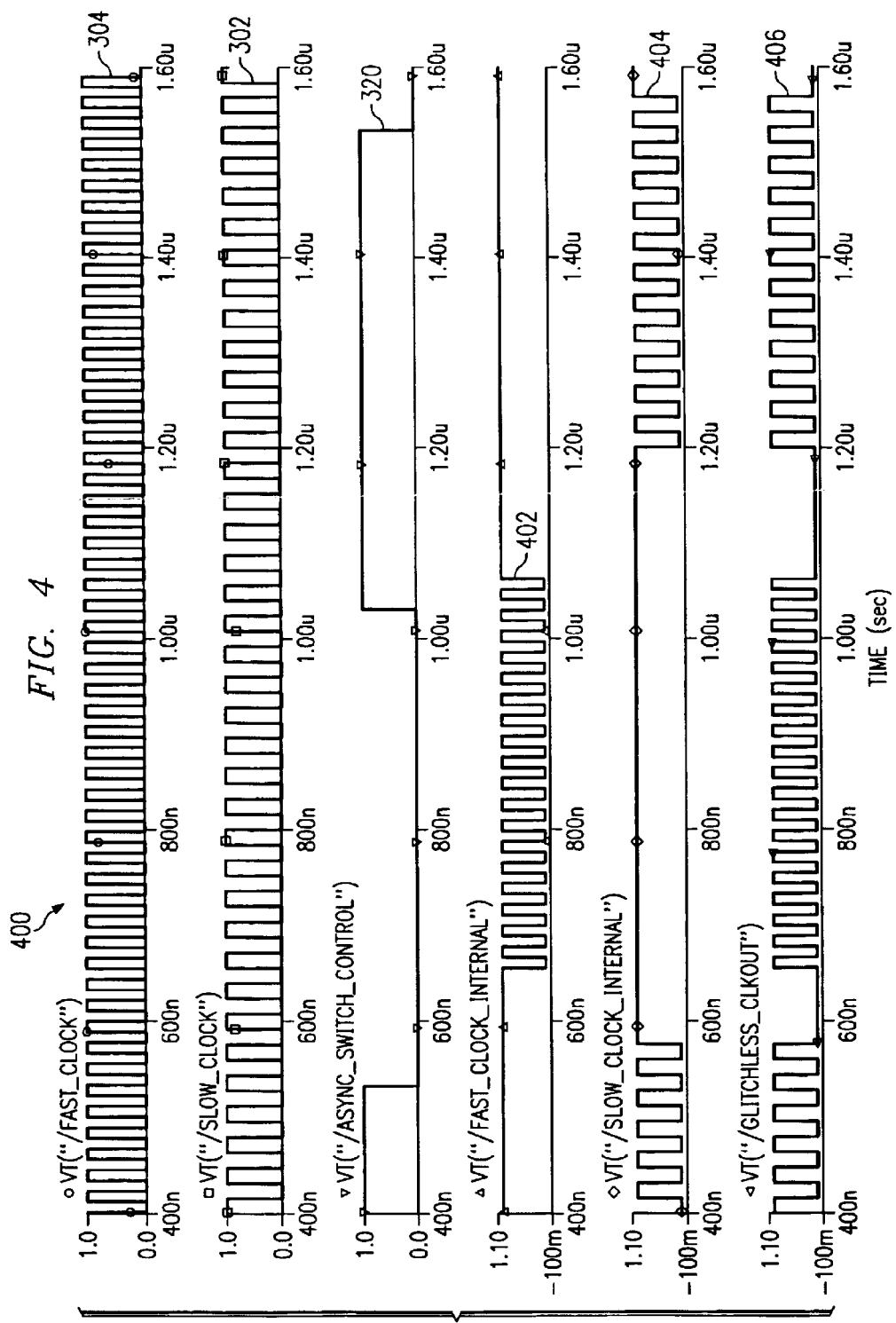
FIG. 4 is a waveform diagram illustrating the transient response characteristics associated with the circuit depicted in FIG. 3 using a Spice representation.

FIG. 4 is a waveform diagram 400 illustrating the transient response characteristics associated with the circuit 300 presented using Spice representation. The glitch free clock multiplexing circuit 300 was integrated as part of an all digital PLL where the SLOW-CLOCK 302 represents the input reference clock while the FAST-CLOCK 304 represents the high frequency digital PLL output clock. During the PLL acquisition period, the input reference clock 302 is sent to the output of the multiplexer. Once the digital PLL detects a lock condition, a control signal 320 is issued to switch the output clock 406 from input reference clock 302 to PLL output clock 304. As shown in FIG. 4, the INTERNAL-SLOW-CLOCK 404 is terminated first; and after two FAST-CLOCK 304 synchronization cycles, the INTERNAL-FAST-CLOCK 402 begins to drive the output clock 406.

Figure 5:
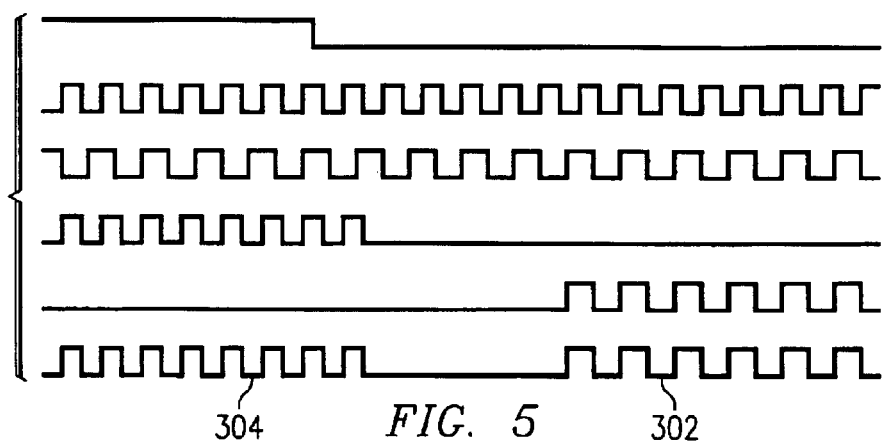
FIG. 5 is a Spice simulation showing the functionality of the glitch free clock multiplexer shown in FIG. 3 switching from high frequency clock to low frequency clock.

The present inventors found this same circuit to also perform the desired glitch free switching when it switches from a fast clock to a slow clock due to the symmetrical topology. Although the output clock 406 behaves well without any glitches when switching from a fast clock to a slow clock however, the switch over time was found to degrade by as much as two slow clock cycles in addition to two fast clock cycles in the worst case scenario after the slow clock has been terminated. FIG. 5 shows a Spice simulation that illustrates glitch free clock switching from high frequency clock 304 to low frequency clock 302 for the glitch free clock multiplexing circuit 300.

In summary explanation, the embodiments described herein above provide a glitch free clock multiplexing circuit that substantially eliminates glitching and short cycled problems associated with many embedded electronic systems frequently requiring certain circuit modules to be turned on and off or running at different clock frequencies, depending upon the state of the systems. By first turning off the active output clock source at a known state, then synchronously turning on the new desired output clock source, the glitch free clock multiplexing circuit guarantees a glitch free switch over without short cycle problems. The glitch free clock multiplexing circuit further includes cascaded synchronization circuits to eliminate potential meta-stability problems that might arise when the switch control signal is completely asynchronous to either clock source. The embodiments described herein before do not require any tri-state buffering or complicated state machine. All clock and control signals can be completely asynchronous to each other, while the glitch free clock multiplexing circuit eases any potential meta-stability and guarantees an output clock that is glitch free and without short cycling, as stated herein before. The desired switch over can occur at any time, even when the circuit modules are active; and the switch over is completed after two target clock cycles from when the active clock is terminated in the best case switching from slow to fast clock, or maximum of four target clock cycles switching from fast to slow clock. The embodiments described herein above employ symmetric switching circuits in both clock direction which guarantees the output clock can be switched in both direction without any restrictions.

In view of the above, it can be seen the present invention presents a significant advancement in the art of clock multiplexing circuits. Further, this invention has been described in considerable detail in order to provide those skilled in the clocking system art with the information needed to apply the novel principles and to construct and use such specialized components as are required.

Further, in view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A clock multiplexer comprising:
a first cascaded synchronization circuit configured to generate a first output clock in response to a reference clock and a switch control signal, said first cascaded synchronization circuit including a first cascaded flip-flop circuit generating an output signal in response to said switch control signal and said reference clock, a second cascaded flip-flop circuit-generating an output signal in response to the output of said first cascaded flip-flop circuit and a fast clock, a first combinational element generating an output signal in response to the output signals of said first and second cascaded flip-flop circuits, a third cascaded flip-flop circuit generating an output signal in response to the output signal of said first combinational element and said reference dock, a second combinational element generating said first output clock in response to the cutout signals of said first and third cascade flip-flop circuits and said reference clock;

a second cascaded synchronization circuit configured to generate a second output clock in response to said fast clock and the switch control signal, said second cascaded synchronization circuit including a fourth cascaded flip-flop circuit generating an output signal in response to said switch control signal and said fast clock, a fifth cascaded flip-flop circuit generating an output signal in response to the output of said fourth cascaded flip-flop circuit and said reference clock, a third combinational element generating an output signal in response to the output signals of said fourth and fifth cascaded flip-flop circuits, a sixth cascaded flip-flop circuit generating an output signal in response to the cutout signal of said third combinational element and said fast clock, a fourth combinational element generating said second output clock in response to the output signals of said fourth and sixth cascaded flip-flop circuits and said fast clock; and a fifth combinational element configured to generate a substantially glitchless output clock in response to the first output clock and the second output clock.

2. The clock multiplexer according to claim 1 wherein the switch control signal is asynchronous to the reference clock and the fast clock.

3. The clock multiplexer according to claim 1 wherein the first and third combinational elements are logic AND devices and the second fourth and fifth combinational element are logic NAND devices.

4. The clock multiplexer according to claim 1 wherein the substantially glitchless output clock is devoid of short cycling.

5. The clock multiplexer according to claim 1 wherein the reference clock is asynchronous to the fast clock and the switch control signal.

6. The clock multiplexer according to claim 1 wherein the fast clock is asynchronous to the reference clock and the switch control signal.

7. The clock multiplexer according to claim 1 wherein the first and second cascaded synchronization circuits have identical structures.

8. The clock multiplexer according to claim 1 wherein the clock multiplexer is devoid of any state machine or tri-state buffers.

* * * * *